United States Patent
Nancekievill et al.

(10) Patent No.: US 7,358,760 B1
(45) Date of Patent: Apr. 15, 2008

(54) EFFICIENT 4:1 MULTIPLEXER FOR PROGRAMMABLE CHIPS

(75) Inventors: Dominic Nancekievill, High Wycombe (GB); Paul Metzgen, Chiswick (GB)

(73) Assignee: Altera Corporation, San Jose, CA (US)

(*) Notice: Subject to any disclaimer, the term of this patent is extended or adjusted under 35 U.S.C. 154(b) by 48 days.

(21) Appl. No.: 10/997,792

(22) Filed: Nov. 24, 2004

(51) Int. Cl.
*H03K 19/173* (2006.01)
*H03K 17/00* (2006.01)

(52) U.S. Cl. .......................... 326/38; 327/407
(58) Field of Classification Search ................ 326/38, 326/40, 46, 105; 327/407; 716/16
See application file for complete search history.

(56) References Cited

U.S. PATENT DOCUMENTS

| | | | |
|---|---|---|---|
| 5,546,018 A | 8/1996 | New et al. | |
| 6,086,629 A * | 7/2000 | McGettigan et al. | 716/12 |
| 6,118,300 A * | 9/2000 | Wittig et al. | 326/41 |
| 6,236,229 B1 | 5/2001 | Or-Bach | |
| 6,476,634 B1 | 11/2002 | Bilski | |
| 2003/0231766 A1 * | 12/2003 | Hanounik | 380/43 |

OTHER PUBLICATIONS

Mitra et al., "Efficient Multiplexer Synthesis Techniques", Multiplexer Synthesis, IEEE Design & Test of Computers, Oct.-Nov. 2000, pp. 2-9.
Metzgen, et al., "An Efficient Multiplexer for Programmable Chips", Altera Corporation, U.S. Appl. No. 10/870,518, filed Jun. 16, 2004, pp. 1-31.
U.S. Appl. No. 10/870,518, Office Action dated Sep. 20, 2005.
U.S. Appl. No. 10/870,518, Office Action dated May 5, 2006.
Final Office Action, U.S. Appl. No. 10/870,518, mailed Oct. 23, 2006.
Office Action, U.S. Appl. No. 10,870,518, mailed Feb. 26, 2007.
Notice of Allowance, U.S. Appl. No. 10/870,518, mailed Aug. 2, 2007.
Allowed claims, U.S. Appl. No. 10/870,518.

* cited by examiner

*Primary Examiner*—Daniel D. Chang
(74) *Attorney, Agent, or Firm*—Beyer Weaver LLP

(57) ABSTRACT

Methods and apparatus are provided for implementing efficient multiplexers on a programmable chip using a lookup table (LUT). A load logic input line associated with a LUT having limited input lines is used to augment the number of input lines that can be handled by a particular LUT. A reset logic input line associated with a LUT is further used to augment the number of input lines. Load logic, reset logic, and a LUT having four input lines can be used to implement a 4:1 multiplexer having seven input lines including four data and three control lines.

30 Claims, 8 Drawing Sheets

| Table 641 ↘ | Output Value Based On c1, c2, and c3 ||||
|---|---|---|---|---|
| | c3 | c2 | c1 | Output |
| | 1 | X | X | 1 |
| | 0 | 1 | X | d3 |
| | 0 | 0 | 1 | d2 |
| | 0 | 0 | 0 | d1 |

EFFICIENT 4:1 MULTIPLEXER FOR PROGRAMMABLE CHIPS

CROSS REFERENCE TO RELATED APPLICATIONS

This application is related to U.S. Provisional Application No. 60/534,662 filed Jan. 6, 2004 and titled "AN EFFICIENT MULTIPLEXER FOR PROGRAMMABLE CHIPS" and to U.S. patent application Ser. No. 10/870,518 filed on Jun. 16, 2004, the entireties of which are incorporated by reference for all purposes.

BACKGROUND OF THE INVENTION

1. Field of the Invention

The present invention relates to implementing a multiplexer using a small set of resources on a programmable chip. In one example, the present invention relates to methods and apparatus for efficiently implementing a 4:1 multiplexer using minimal resources.

2. Description of Related Art

Conventional processors including general purpose processors, digital signal processors, video accelerators, and other hardware devices typically use multiplexer circuitry. Multiplexer circuitry allows one of multiple input lines to be selected for output based on control information. One particular multiplexer that is often used is a 4:1 multiplexer. A 4:1 multiplexer allows selection of one of four inputs for output based on control information provided by two or more control lines.

Multiplexers are implemented in a variety of manners. For devices such as application specific integrated circuits (ASICs), multiplexers are relatively inexpensive to implement. However, devices such us field programmable gate arrays (FPGAs) or other programmable chips use multiplexers that are more costly to implement. The multiplexers can be more resource intensive and can also introduce undesired delay into a processing data path. Conventional mechanisms for implementing multiplexers such as 4:1 multiplexers are relatively limited.

Consequently, the techniques of the present invention provide mechanisms for improving the efficiency of multiplexer implementation on programmable chips.

SUMMARY OF THE INVENTION

Methods and apparatus are provided for implementing efficient multiplexers on a programmable chip using a lookup table (LUT). A load logic input line associated with a LUT having limited input lines is used to augment the number of input lines that can be handled by a particular LUT. A reset logic input line associated with a LUT is further used to augment the number of input lines. Load logic, reset logic, and a LUT having four input lines can be used to implement a 4:1 multiplexer having seven input lines including four data and three control lines.

In one embodiment, a programmable chip including a multiplexer is provided. The multiplexer includes a lookup table (LUT) and load logic. A LUT receives a first data input, a second data input, and a first control input and provides a first intermediate output as a function of the first data input, the second data input, and the first control input. Load logic receives the first intermediate output, a third data input, and a second control input and provides a second intermediate value to reset logic. Reset logic selects between a reset value and the second intermediate value based on a third control input.

In another example, a 4:1 multiplexer having four data input lines, three control lines, and an output line is provided. The 4:1 multiplexer includes a first 2:1 multiplexer having two inputs and a first control line. The first 2:1 multiplexer is implemented using a LUT. A second 2:1 multiplexer has two inputs and a second control line. The output of the first 2:1 multiplexer is coupled to an input of the second 2:1 multiplexer. The second 2:1 multiplexer is implemented using load logic associated with the LUT. A third 2:1 multiplexer has two inputs and a third control line. The output of the second 2:1 multiplexer is coupled to a first input of the third 2:1 multiplexer and a constant value coupled to the second input of the third 2:1 multiplexer. The third 2:1 multiplexer is implemented using reset logic associated with the LUT.

In another embodiment, a multiplexer having a lookup table (LUT), register load logic, register reset logic, and a register is provided. The LUT receives a first data line, a second data line, and a control line. The output of the LUT is coupled to the first input of the register load logic and a third data line is coupled to the second input of the register load logic. The output of the register load logic is coupled to the first input of the register reset logic and a constant value is coupled to the second input of the register reset logic. A register is coupled to the output of the register reset logic.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Figure 1:
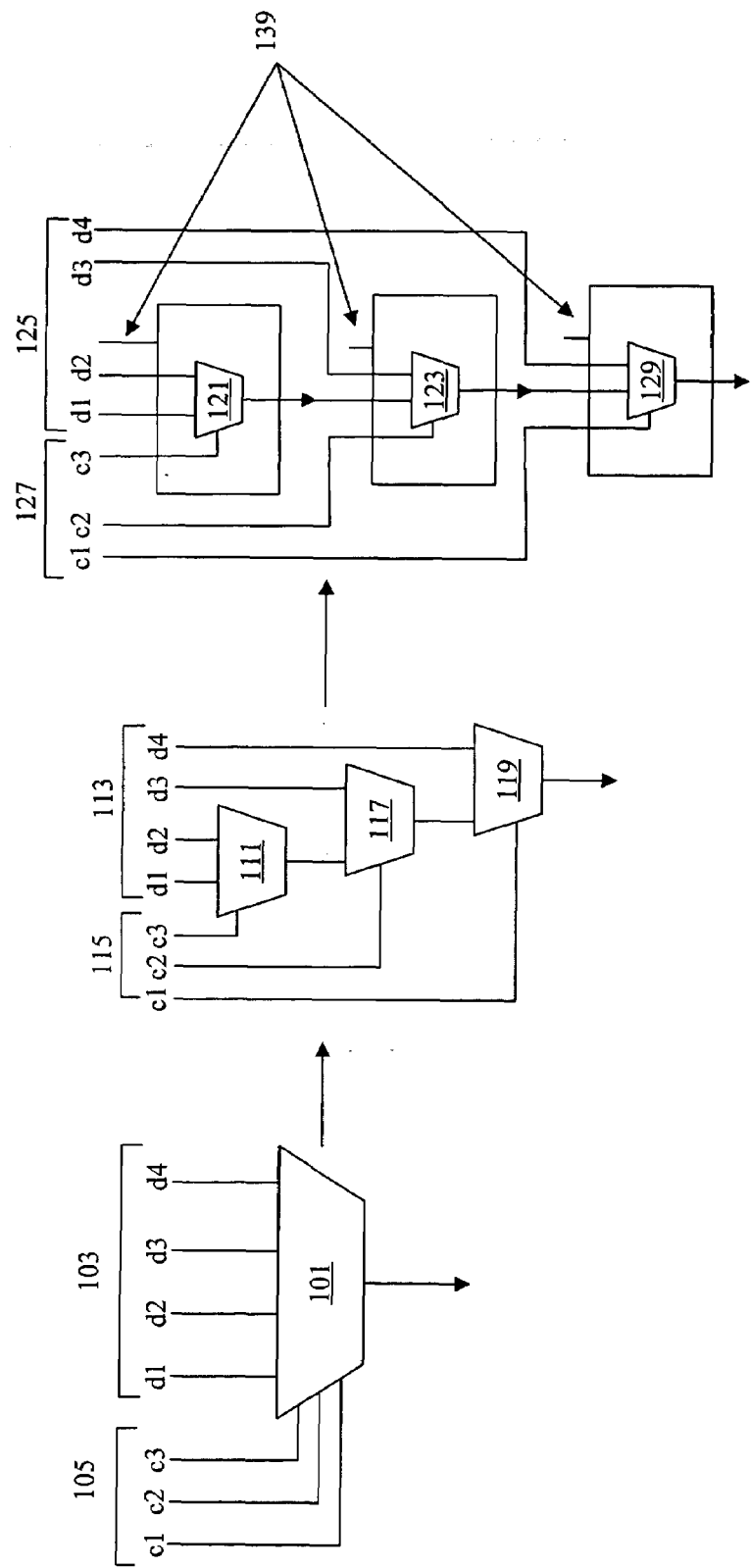
FIG. 1 is a diagrammatic representation showing a 4:1 multiplexer implemented using three lookup tables (LUTs).

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of particular processors and devices. However, it should be noted that the techniques of the present invention can be applied to a variety of types of processors and devices and associated software. In the following description, numerous specific details are set forth in order to provide a thorough understanding of the present invention. The present invention may be practiced without some or all of these specific details. In other instances, well known process operations have not been described in detail in order not to unnecessarily obscure the present invention. Techniques and mechanisms are also often associated with certain processes and components that are optional, unless noted otherwise. Optional processes and components may sometimes be removed or introduced into particular process flows or devices without affecting the operation of the present invention.

Furthermore, techniques and mechanisms of the present invention will sometimes be described in singular form for clarity. However, it should be noted that some embodiments can include multiple iterations of a technique or multiple instantiations of a mechanism unless noted otherwise. For example, a processor is used in a variety of contexts. However, it will be appreciated that multiple processors can also be used while remaining within the scope of the present invention.

Many devices including programmable chips use multiplexers such as 4:1 multiplexers to perform a variety of operations. Any logic or mechanism that takes four inputs and provides an output based on control information is herein referred to as a 4:1 multiplexer. In one embodiment, a 4:1 multiplexer is a hardware component that takes four discrete inputs and two control lines and outputs one of the four discrete inputs. Every input can be output through a unique value of the control lines. In some cases, more than two control lines are provided.

Typical 4:1 multiplexers are implemented in a variety of manners. Many programmable chips include lookup tables (LUT), registers, and routing resources. Lookup tables have N inputs and 1 output. An N input LUT can compute any function of up to N binary inputs. A 4:1 multiplexer is a function of four data inputs and two control inputs for a total of six inputs. The LUTs in many programmable chip architectures such as field programmable gate arrays (FPGAs) have four inputs.

Consequently, a 4:1 multiplexer with six or more inputs cannot fit in a four input LUT, because it is a function of six inputs. It is possible to build a 4:1 multiplexer using three 2:1 multiplexers. A 2:1 multiplexer can be a function of as little as three inputs, i.e., two data lines and one control line. Some implementations can build a 4:1 multiplexer using three LUTs and three control lines. However, the techniques of the present invention provide a 4:1 multiplexer using a single LUT. The techniques of the present invention recognize that logic is often provided with a LUT to handle very particular circumstances. In some example, a LUT is provided with register load logic and register reset logic along with a register in a single logic element.

The register reset logic is used to allow loading of the register independent of the output of the LUT. The register reset logic is used to allow reset of the value in the register also independent of the output of the LUT. The techniques of the present invention recognize that by using these infrequently used resources, a 4:1 multiplexer can be implemented using a single LUT. Implementing a 4:1 multiplexer using a single LUT conserves resources on a programmable chip and also reduces processing latency.

FIG. 1 is a diagrammatic representation showing one example of a conventional 4:1 multiplexer implemented using three LUTs and register pairs. A 4:1 multiplexer 101 includes four input data lines 103 and three control lines 105. According to various embodiments, each input data line 41, d2, d3, and d4 and each control line c1, c2, and c3 are a single bit. A 4:1 multiplexer 101 can be implemented using three 2:1 multiplexers, each 2:1 multiplexer implemented with a four input LUT. Three 2:1 multiplexers 111, 117, and 119 take input data lines 113 along with control lines 115 to allow implementation of a 3:1 multiplexer.

Each 2:1 multiplexer can be implemented using a four input LUT. According to various embodiments, three 2:1 multiplexers are implemented using LUTs 121, 123, and 129. LUT 121 takes two data input lines d1 and d2 from the set of data input lines 125 and takes a control line c3 from the set of control lines 127 and provides a first intermediate value to a second LUT 123. The second LUT 123 takes the first intermediate value and data input line d3 and control line c2 and provides a second intermediate value to a third LUT 129. The third LUT 129 takes the remaining data line d4 and the remaining control line c1 and provides a multiplexer output value. It should be noted that while three LUTs and three control lines are needed, input lines 139 remain unused.

Figure 2:
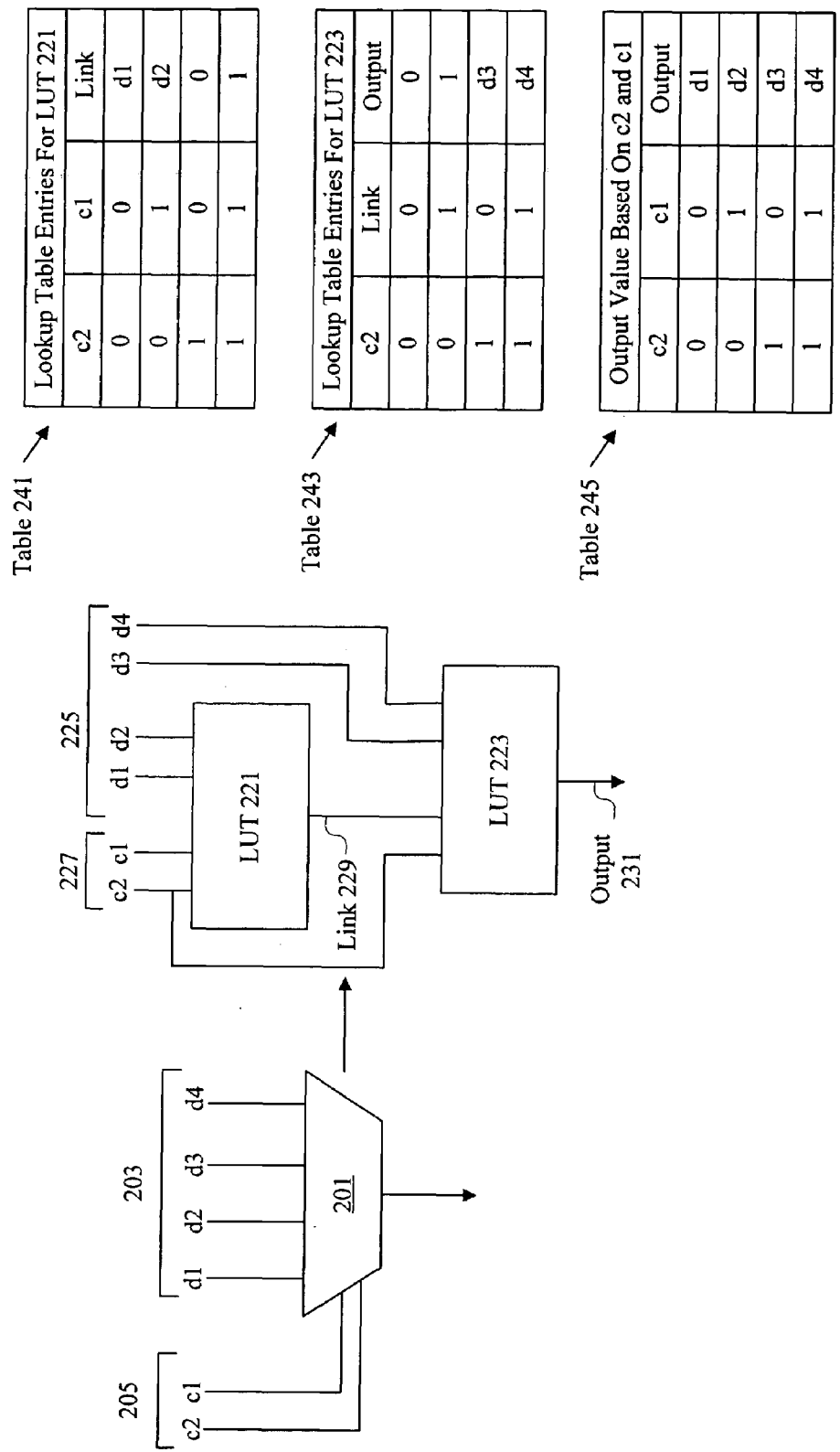
FIG. 2 is a diagrammatic representation showing a 4:1 multiplexer implemented using two LUTs.

It is also possible to implement a 4:1 multiplexer using two four-input LUTs. FIG. 2 is a diagrammatic representation showing the implementation of a 4:1 multiplexer using two four-input LUTs. A 4:1 multiplexer 201 includes four input data lines 203 and two control lines 205. According to various embodiments, each input data line d1, d2, d3, and d4 and each control line c1 and c2 are a single bit. A 4:1 multiplexer 201 can be implemented using a pair of four input LUTs.

LUT 221 takes control lines c1 and c2 along with the data values d1 and d2 and provides a link value 229 as shown in table 241. If the value of c2 is 0, either the value of d1 or d2 is provided as the link value 229 based on the value of c1. If the value of c2 is 1, the value of c1 is provided as the link value 229.

LUT 223 takes control line c2, the link value 229, and data values d3 and d4 as shown in table 243. If the value of c2 is 0, the output provided is the link value. Consequently, if the value of c2 is 0, the output value 231 is the value of d1 or d2 based on whether the value of c1 is 0 or 1. If the value of c2 is 1, the output provided is the value of d3 or d4 based on whether the link value is 0 or 1. Consequently, if the value of c2 is 1, the output value 231 is the value of d3 or d4 based on whether the value of c1 is 0 or 1. The output values provided based on the control lines are shown in table 245.

As will be appreciated, LUTs are limited resources and each LUT is associated with a LUT delay. Consequently, to optimize efficiency, it is typically beneficial to minimize the use of LUTs and interconnections between LUTs. Although two LUTs are used to implement a 4:1 multiplexer, resources remain unused.

The techniques of the present invention recognize that resources are wasted when a 4:1 multiplexer is implemented using two LUTs and register pairs. Consequently, techniques and mechanisms are provided for improving the implementation of 4:1 multiplexers and other N:1 multiplexers.

According to various embodiments, many programmable chips such as FPGAs provide a register for every LUT. In one example, a LUT is provided with a register in a logic-element or logic cell. The register input is fed by the LUT. Often, logic is provided between the LUT output and the register input to allow the register value to be loaded independent of the LUT. For example, the register may be loaded by either the LUT or some other mechanism. Any mechanism that allows a register to be loaded independent of a LUT is referred to herein as register load logic or load logic.

Additional logic is often provided between the LUT output and the register input that allows the register value to be reset independent of the LUT. Any mechanism that allows a register to be reset independent of a LUT is referred to herein as register reset logic or reset logic. In many instances, the register reset logic allows the register to be reset independent of the LUT and independent of any register load value. According to various embodiments, a LUT, a register, register load logic, and register reset logic are provided in a single logic element or logic cell on a programmable device. The LUT, register load logic, and register reset logic can be provided in a variety of arrangements. For example, data may be passed from the LUT to the register load logic to the register reset logic and finally to a register. Alternatively, data may be passed from the LUT to the register reset logic to the register load logic and finally to the register.

Figure 3:
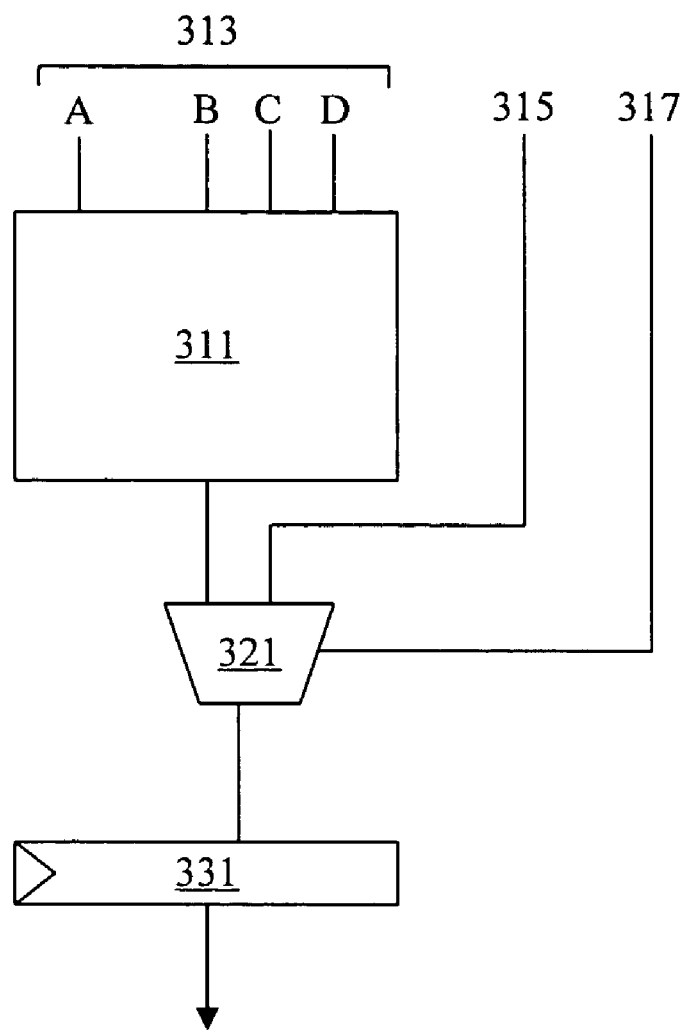
FIG. 3 is a diagrammatic representation showing a LUT and an associated register having load logic.

FIG. 3 is a diagrammatic representation showing a LUT and an associated register having load logic. According to various embodiments, LUT 311 has four input lines 313 and provides an input value to logic 321. In one example, logic 321 is register load logic provided with a LUT. The logic 321 is used to take either the output of the LUT 311 and provide the output to the register 331 or take an input 315 and provide the input 315 to the register 331. The value selected is based on a control line 317.

Figure 4:
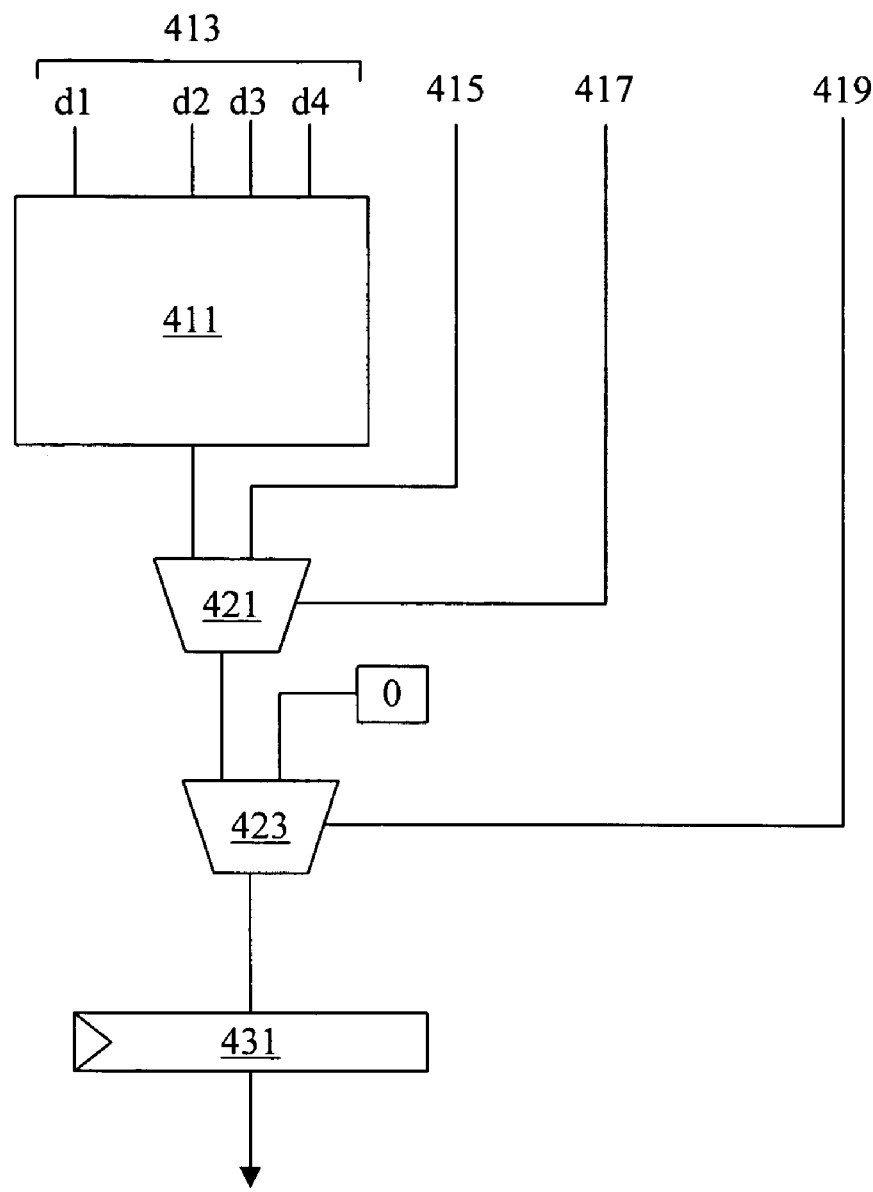
FIG. 4 is a diagrammatic representation showing a LUT and an associated register having load logic and reset logic.

FIG. 4 is a diagrammatic representation showing a LUT and an associated register having register load logic and register reset logic. According to various embodiments, LUT 411 has four input lines 413 and provides an input value to logic 421. In one example, logic 421 is register load logic provided with a LUT. The logic 421 is used to take either the output of the LUT 411 and provide the output to logic 423 or take an input 415 and provide the input 415 to the register 431. In one example, input 415 is a register load value. The value selected is based on control line 417. In one example, logic 423 is register reset logic provided with a LUT. Logic 423 takes the output of the register load logic 421, which is either the output of the LUT 411 or the input 415 along with a reset value of 0 and selects one of the values to provide to the register 431 based on control line 419. In one example, control line 419 is a reset control line.

Register load logic 421 and register reset logic 423 are provided for very specific circumstances and are infrequently used features in a logic element or logic cell. According to various embodiments, if the output of the LUT is intended to feed a register and one of the inputs to the 4:1 multiplexer is a constant value, then the logic 421 and 423 can be used to implement a 4:1 multiplexer using a single LUT. The techniques of the present invention recognize that the circumstances allowing the implementation of a 4:1 multiplexer using a single LUT occur rather frequently. In many instances, an input to a 4:1 multiplexer is constant at the time of logic synthesis.

Figure 5:
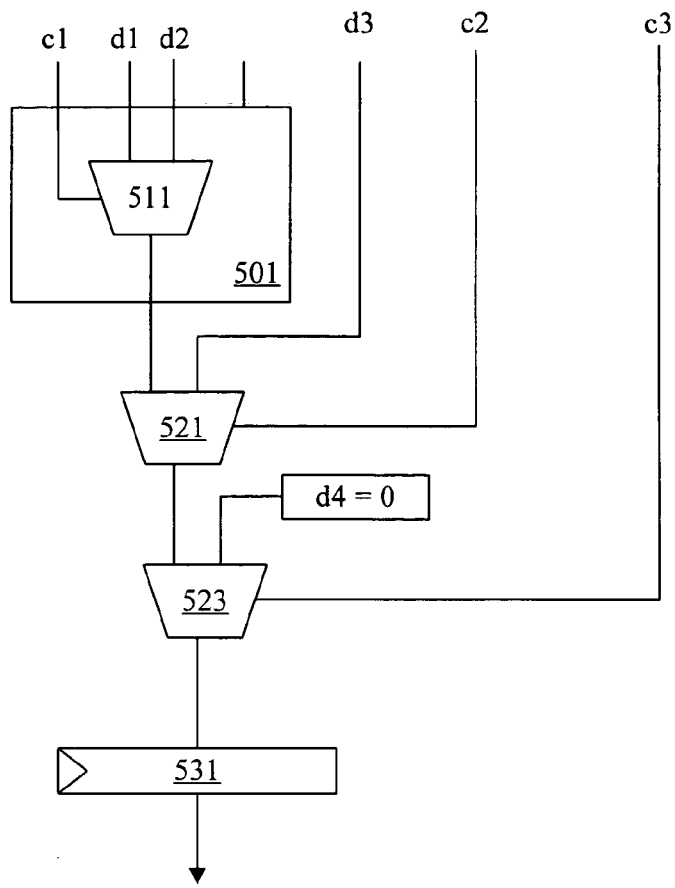
FIG. 5 is a diagrammatic representation showing one example of a 4:1 multiplexer having a constant 0 input implemented using a single LUT.

FIG. 5 is a diagrammatic representation showing the implementation of a 4:1 multiplexer using a single four input LUT. According to various embodiments, a LUT 501 is associated with register load logic 521, register reset logic 523, and a register 531. The LUT 501 is used to implement a 2:1 multiplexer that takes data lines d1 and d2 and control line c1. Register load logic 521 selects either the output of the LUT 501 or the value of data line d3 using control line c2. Register reset logic 523 selects either the output of logic 521 or the constant value 0, where d4 is a constant value of 0. The selection is made using control line c3 and an output is provided to register 531.

As shown in table 541, if the value of c3 is 1, the values of c2 and c1 can be ignored and the reset constant value of 0 is provided as output to the register 531. If the value of c3 is 0, then c2 and c1 are used to select an output. If the value of c2 is 1, the value d3 is provided as output. Otherwise, either d1 or d2 is provided based on the control line c1. FIG. 5 is a diagrammatic representation showing the implementation of a 4:1 multiplexer when one of the inputs is a constant value of 0.

Figure 6:
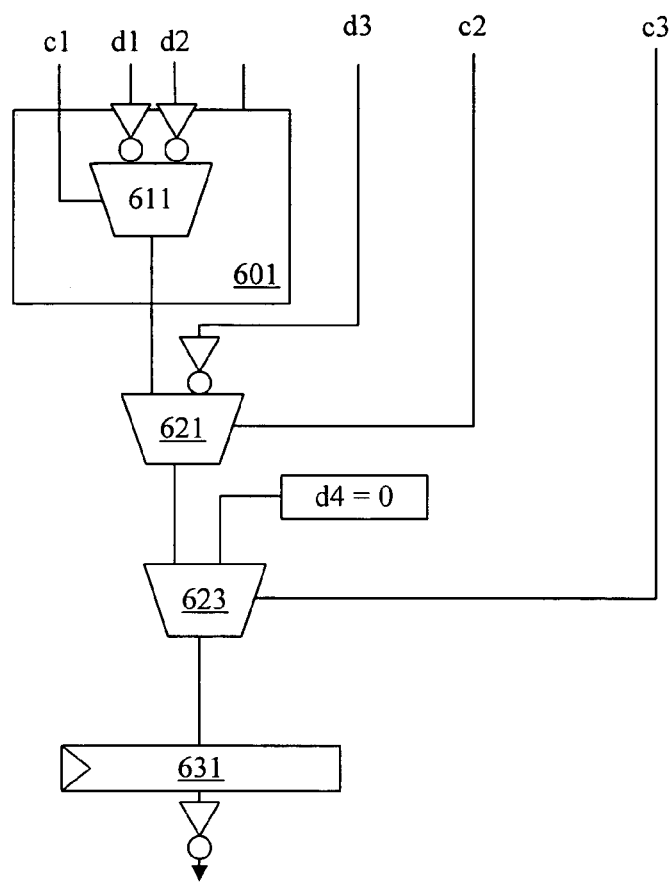
FIG. 6 is a diagrammatic representation showing one example of a 4:1 multiplexer having a constant 1 input implemented using a single LUT.

FIG. 6 is a diagrammatic representation depicting an implementation of a 4:1 multiplexer when one of the inputs is a constant value of 1. According to various embodiments, a LUT 601 is associated with register load logic 621, register reset logic 623, and a register 631. The LUT 601 is used to implement a 2:1 multiplexer that takes data lines d1 and d2 and control line c1. Data lines d1 and d2 are passed through inverters before being provided to LUT 601. Register load logic 621 selects either the output of the LUT 601 or the value of data line d3 using control line c2. Data line d3 is also passed through an inverter before being provided to register load logic 621. Register reset logic 623 selects either the output of logic 621 or the constant value 1, where d4 is a constant value of 1. The selection is made using control line c3 and an output is inverted before being provided to register 631.

As shown in table 641, if the value of c3 is 1, the values of c2 and c1 can be ignored and the inverted reset constant value of 1 is provided as output to the register 631. A value of 1 is provided even though the reset value remains 0. If the value of c3 is 0, then c2 and c1 are used to select an output. If the value of c2 is 1, the value d3 is provided as output. Otherwise, either d1 or d2 is provided based on the control line c1.

The techniques and mechanisms of the present invention provide a 4:1 multiplexer that can be implemented using a single LUT whether a constant value provided to the 4:1 multiplexer is 1 or 0. When the reset value is 0, no inversion is needed. However, when the reset value is 1, inversion is used to flip the predetermined 0 reset value. Inversion generally costs next to nothing on programmable chips. In one example, inversion entails changing individual bits in a LUT. The techniques of the present invention recognize that many 4:1 multiplexers are implemented with at least one constant input as determined at the time of logic synthesis.

According to various embodiments, inversion actually occurs in the LUT without separate inverters. In some examples, inversion back is not done before the register, but instead the value stored in the register would be inverted relative to the true value, and the output of the register would be inverted back wherever it is fed to other logic.

Logic elements can be implemented using components such as antifuses, static RAM, and EPROMS. Any mechanism on a programmable chip that performs an operation on a given number of input lines to provide one or more outputs based on information programmed is herein referred to as a logic element. Some logic elements are implemented as combinations of LUTs and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register.

Figure 7:
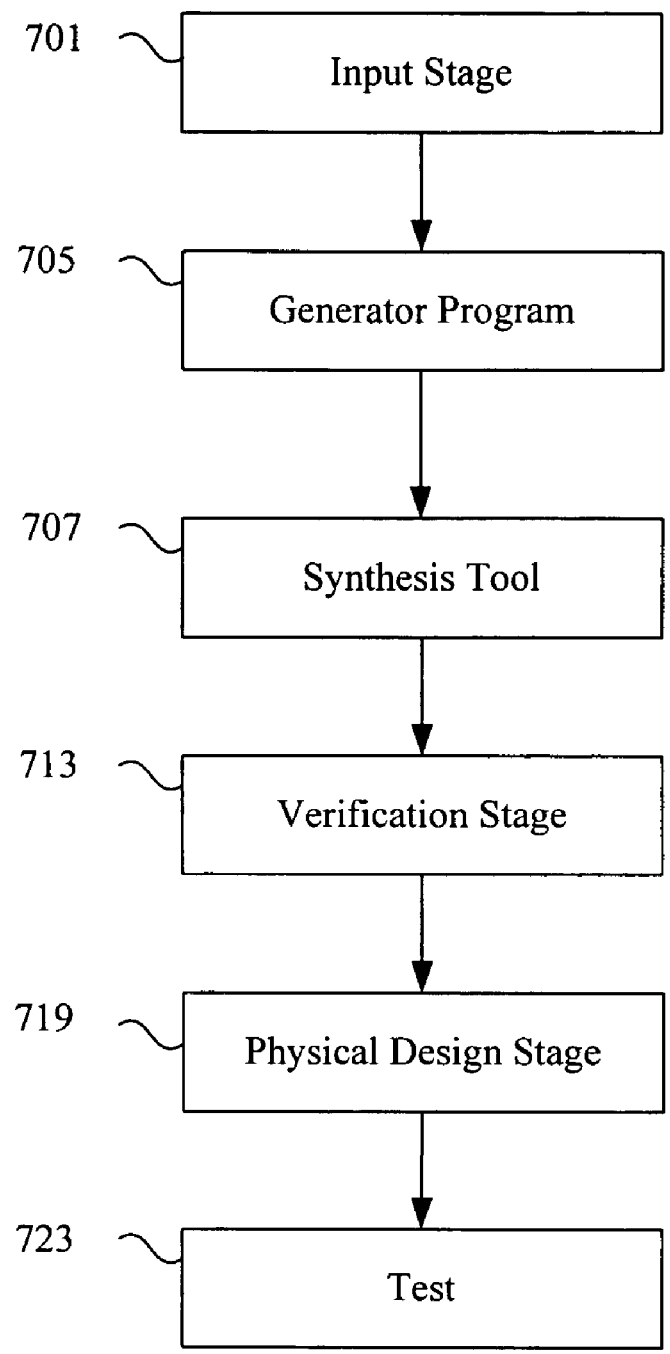
FIG. 7 is a diagrammatic representation showing a technique for implementing the programmable chip.

FIG. 7 is a diagrammatic representation showing implementation of a programmable chip. In one example, a number of 4:1 multiplexers are implemented on the programmable chip. According to various embodiments, an input stage 701 receives selection information typically from a user for logic such as a processor core as well as other components such as a streaming output device to be implemented on an electronic device. In one example, the input received is in the form of a high-level language program. A generator program 705 creates a logic description and provides the logic description along with other customized logic to any of a variety of synthesis tools, place and route programs, and logic configuration tools to allow a logic description to be implemented on an electronic device.

In one example, an input stage 701 often allows selection and parameterization of components to be used on an electronic device. The input stage 701 also allows configuration of variable or fixed latency support. In some examples, components provided to an input stage include intellectual property functions, megafunctions, and intellectual property cores. The input stage 701 may be a graphical user interface using wizards for allowing efficient or convenient entry of information. The input stage may also be a text interface or a program reading a data file such as a spreadsheet, database table, or schematic to acquire selection information. The input stage 701 produces an output containing information about the various modules selected.

In typical implementations, the generator program 705 can identify the selections and generate a logic description with information for implementing the various modules. The generator program 705 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 705 identifies pointers and provides ports for each pointer. One tool with generator program capabilities is System on a Programmable Chip (SOPC) Builder available from Altera Corporation of San Jose, Calif. The generator program 705 also provides information to a synthesis tool 707 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 701, generator program 705, and synthesis tool 707 can be separate programs. The interface between the separate programs can be a database file, a log; or simply messages transmitted between the programs. For example, instead of writing a file to storage, the input stage 701 can send messages directly to the generator program 705 to allow the generator program to create a logic description.

Similarly, the generator program can provide information directly to the synthesis tool instead of writing HDL files. Similarly, input stage 701, generator program 705, and synthesis tool 707 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 707.

A synthesis tool 707 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 713 typically follows the synthesis stage 707. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 713, the synthesized netlist file can be provided to physical design tools 719 including place and route and configuration tools. A place and route tool typically locates logic cells on specific logic elements of a target hardware device and connects wires between the inputs and outputs of the various logic elements in accordance with logic required to implement an electronic design. The device can also be physically tested at 723.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 701, the generator program 705, the synthesis tool 707, the verification tools 713, and physical design tools 719 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 8:
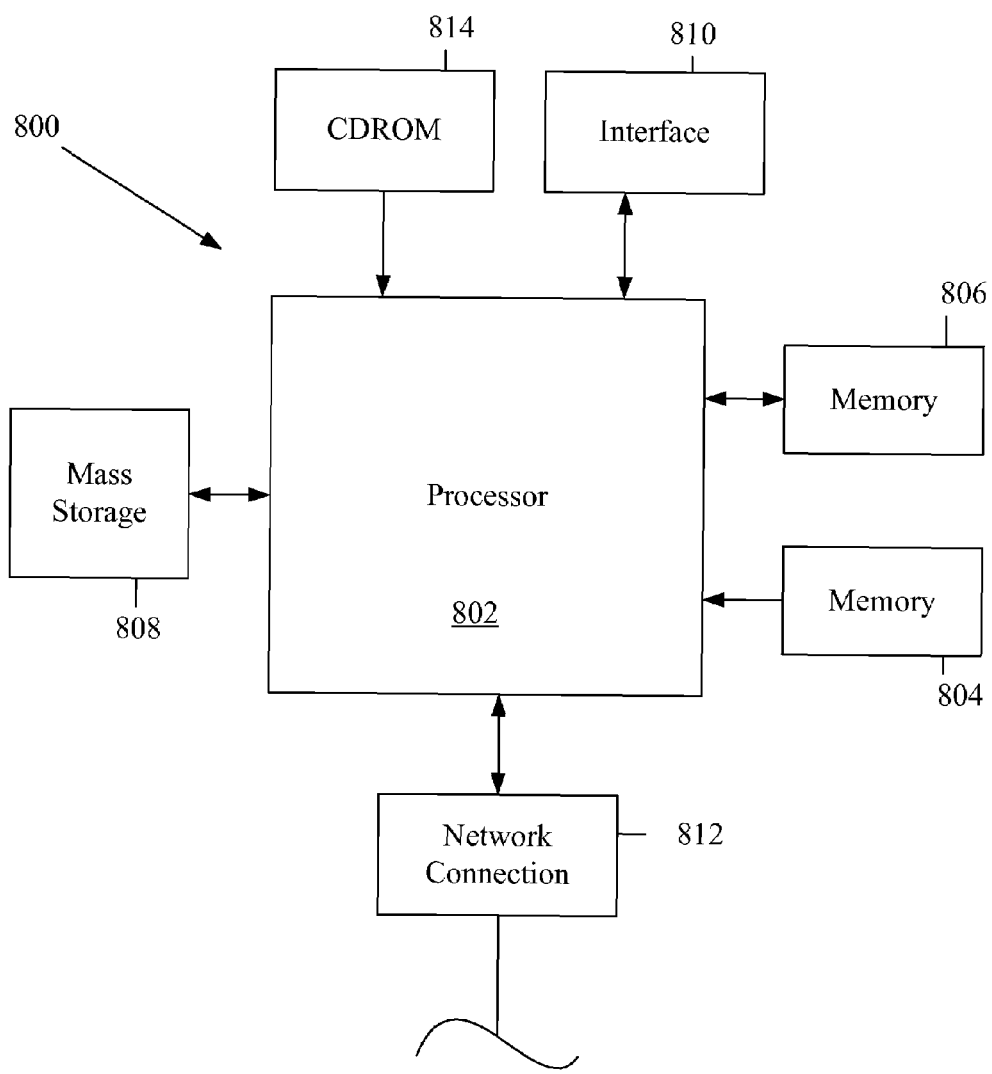
FIG. 8 is a diagrammatic representation depicting a computer system.

FIG. 8 illustrates a typical computer system that can be used to implement a programmable chip having shared I/O lines. The computer system 800 includes any number of processors 802 (also referred to as central processing units, or CPUs) that are coupled to devices including memory 806 (typically a random access memory, or "RAM"), memory 804 (typically a read only memory, or "ROM"). The processors 802 can be configured to generate a test sequences for any designated processor. As is well known in the art, memory 804 acts to transfer data and instructions uni-directionally to the CPU and memory 806 is used typically to transfer data and instructions in a bi-directional manner.

Both of these memory devices may include any suitable type of the computer-readable media described above. A mass storage device 808 is also coupled bi-directionally to CPU 802 and provides additional data storage capacity and may include any of the computer-readable media described above. The mass storage device 808 may be used to store programs, data and the like and is typically a secondary storage medium such as a hard disk that is slower than memory. The mass storage device 808 can be used to hold a library or database of prepackaged logic or intellectual property functions, as well as information on generating particular configurations. It will be appreciated that the information retained within the mass storage device 808, may, in appropriate cases, be incorporated in standard fashion as part of memory 806 as virtual memory. A specific mass storage device such as a CD-ROM 814 may also pass data uni-directionally to the CPU.

CPU 802 is also coupled to an interface 810 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 802 optionally may be coupled to a computer or telecommunications network using a network connection as shown generally at 812. With such a network connection, it is contemplated that the CPU might receive information from the network, or might output information to the network in the course of performing the above-described method steps. It should be noted that the system 800 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 808 or 814 and executed on CPU 808 in conjunction with primary memory 806.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of primary and secondary components and should not be restricted to the ones mentioned above. It is therefore intended that the invention be interpreted to include all variations and equivalents that fall within the true spirit and scope of the present invention.

What is claimed is:

1. A programmable chip including a multiplexer, the multiplexer comprising:
    a lookup table (LUT) operable to receive a first data input, a second data input, and a first control input, wherein the LUT is configured to provide a first intermediate output as a function of the first data input, the second data input, and the first control input;
    load logic operable to receive the first intermediate output, a third data input, and a second control input and provide a second intermediate value to reset logic, wherein the reset logic selects between a reset value and the second intermediate value based on a third control input, wherein the LUT is provided with the load logic and the reset logic in a logic element.

2. The programmable chip of claim 1, wherein the first data input, the second data input, the third data input, the reset value, the first control input, the second control input, and the third control input are bits.

3. The programmable chip of claim 2, wherein the first control input is used to select either the first data input or the second data input as the first intermediate output.

4. The programmable chip of claim 2, wherein the second control input is used to select either the third data input or the first intermediate output as the second intermediate output associated with the multiplexer.

5. The programmable chip of claim 1, wherein the multiplexer is a 4:1 multiplexer implemented on a programmable chip.

6. The programmable chip of claim 1, wherein the LUT is a four input LUT associated with load logic, reset logic, and a register in the logic element.

7. The programmable chip of claim 6, wherein the load logic is a multiplexer associated with the LUT that allows the register to be loaded independent of the LUT output.

8. The programmable chip of claim 6, wherein the reset logic is a multiplexer associated with the LUT that allows the register to be reset independent of the LUT output.

9. A 4:1 multiplexer having four data input lines, three control lines, and an output line, the 4:1 multiplexer, comprising:
    a first 2:1 multiplexer, the first 2:1 multiplexer having two inputs and a first control line, the first 2:1 multiplexer implemented using a LUT;
    a second 2:1 multiplexer having two inputs and a second control line, the output of the first 2:1 multiplexer coupled to an input of the second 2:1 multiplexer;
    a third 2:1 multiplexer having two inputs and a third control line, the output of the second 2:1 multiplexer coupled to a first input of the third 2:1 multiplexer and a constant value coupled to the second input of the third 2:1 multiplexer;
    wherein the second and third 2:1 multiplexers are implemented using load logic and reset logic associated with the LUT, wherein the LUT is provided with the load logic and the reset logic in a logic cell.

10. The 4:1 multiplexer of claim 9, wherein the LUT is a four input LUT.

11. The 4:1 multiplexer of claim 10, wherein the LUT is a four input LUT and the 4:1 multiplexers is a function of 7 inputs.

12. The 4:1 multiplexer of claim 9, wherein load logic and reset logic is associated with the LUT and a register implemented in a logic element.

13. The 4:1 multiplexer of claim 9, wherein the constant value is a reset value of 0.

14. The 4:1 multiplexer of claim 9, wherein one of the four data input lines is a constant value of 0.

15. The 4:1 multiplexer of claim 9, wherein one of the four data input lines is a constant value of 1.

16. The 4:1 multiplexer of claim 15, wherein when one of the four data input lines is the constant value of 1, the remaining data lines and the output line are inverted.

17. The 4:1 multiplexer of claim 9, wherein the 4:1 multiplexer is associated with only one LUT delay.

18. A multiplexer, comprising:
a lookup table (LUT) receiving a first data line, a second data line, and a control line;
register load logic, the output of the LUT coupled to the first input of the register load logic and a third data line coupled to the second input of the register load logic;
register reset logic, the output of the register load logic coupled to the first input of the register reset logic and a constant value is coupled to the second input of the register reset logic;
a register coupled to the output of the register reset logic, wherein the LUT is provided with the register load logic and the register reset logic in a logic cell.

19. The multiplexer of claim 18, wherein a fourth data line is a constant reset value of 0.

20. The multiplexer of claim 18, wherein a fourth data line is a constant value of 1.

21. The multiplexer of claim 20, wherein the first data line, second data line, third data line, and an output line are inverted when the constant value is 1.

22. The multiplexer of claim 19, wherein a first control line is used to select between a first data line and a second data line at the LUT.

23. The multiplexer of claim 22, wherein a second control line is used to select between the LUT output and a third data line.

24. The multiplexer of claim 23, wherein a third control line is used to select between a the register load logic output and a constant value.

25. A programmable chip including a multiplexer, the multiplexer comprising:
a lookup table (LUT) means operable to receive a first data input, a second data input, and a first control input, wherein the LUT means is configured to provide a first intermediate output as a function of the first data input, the second data input, and the first control input;
load logic means operable to receive the first intermediate output, a third data input, and a second control input and provide a second intermediate value to reset logic, wherein the reset logic means selects between a reset value and the second intermediate value based on a third control input, wherein the LUT is provided with the load logic means and the reset logic means in a logic cell.

26. The programmable chip of claim 25, wherein the first data input, the second data input, the third data input, the reset value, the first control input, the second control input, and the third control input are bits.

27. The programmable chip of claim 26, wherein the first control input is used to select either the first data input or the second data input as the first intermediate output.

28. The programmable chip of claim 26, wherein the second control input is used to select either the third data input or the first intermediate output as the second intermediate output associated with the multiplexer.

29. A programmable chip including a logic element, the logic element comprising:
a four-input lookup table (LUT);
a register;
load logic operable to load a value into the register regardless of the output of the LUT;
reset logic operable to load a reset value into the register regardless of the output of the LUT;
wherein four input data lines and three control lines are passed to the LUT, the load logic, and the reset logic to implement a 4:1 multiplexer with an output value passed to the register, wherein the LUT is provided with the load logic and the reset logic in a logic element.

30. The programmable chip of claim 29, wherein the logic element is a logic cell.

* * * * *